US008889214B2

(12) United States Patent
Kim et al.

(10) Patent No.: US 8,889,214 B2
(45) Date of Patent: Nov. 18, 2014

(54) DEPOSITION AMOUNT MEASURING APPARATUS, DEPOSITING APPARATUS INCLUDING THE SAME, AND METHOD FOR MANUFACTURING LIGHT EMITTING DISPLAY

(71) Applicants: Kyung-Soo Kim, Yongin (KR); Seong-Ho Jeong, Yongin (KR); Hyun-Keun Song, Yongin (KR); Eu-Gene Kang, Yongin (KR)

(72) Inventors: Kyung-Soo Kim, Yongin (KR); Seong-Ho Jeong, Yongin (KR); Hyun-Keun Song, Yongin (KR); Eu-Gene Kang, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/889,756

(22) Filed: May 8, 2013

(65) Prior Publication Data

US 2014/0127833 A1 May 8, 2014

(30) Foreign Application Priority Data

Nov. 6, 2012 (KR) ........................ 10-2012-0124964

(51) Int. Cl.

| | |
|---|---|
| ***C23C 14/54*** | (2006.01) |
| ***B05C 11/00*** | (2006.01) |
| ***C23C 16/00*** | (2006.01) |
| ***H01L 21/00*** | (2006.01) |
| ***H01L 21/66*** | (2006.01) |
| ***H01L 51/00*** | (2006.01) |
| ***C23C 16/52*** | (2006.01) |
| ***H01L 21/67*** | (2006.01) |
| ***B05B 12/08*** | (2006.01) |

(52) U.S. Cl.

CPC ............ *H01L 22/12* (2013.01); *H01L 51/0008* (2013.01); *C23C 16/52* (2013.01); *C23C 14/543* (2013.01); *H01L 22/20* (2013.01); *H01L 22/26* (2013.01); *H01L 21/67253* (2013.01); *B05B 12/084* (2013.01); *C23C 14/542* (2013.01); *C23C 14/546* (2013.01)

USPC ........ 427/10; 427/9; 438/5; 438/14; 118/712; 118/726; 118/728

(58) Field of Classification Search

CPC ... H01L 21/67253; H01L 22/20; H01L 22/26; H01L 22/12; C23C 16/52; C23C 14/543; C23C 14/546; C23C 14/542; B05B 12/084

USPC ........ 438/5, 14; 427/9, 10; 118/712, 726, 728

See application file for complete search history.

(56) References Cited

U.S. PATENT DOCUMENTS

2002/0192966 A1* 12/2002 Shanmugasundram et al. ............................ 438/692
2003/0012868 A1* 1/2003 Davlin et al. ..................... 427/8
2004/0002171 A1* 1/2004 Gotkis et al. ..................... 438/5
2005/0106763 A1* 5/2005 Hsieh et al. ...................... 438/5

(Continued)

FOREIGN PATENT DOCUMENTS

KR 10-2008-0057879 A 6/2008
KR 10-2008-0081684 A 9/2008

*Primary Examiner* — Karen Kusumakar

(74) *Attorney, Agent, or Firm* — Lee & Morse, P.C.

(57) ABSTRACT

A deposition amount measuring apparatus includes a plate-shaped body having a rotating shaft, a plurality of deposition amount sensors along side surfaces of the body, the deposition amount sensors being configured to measure an amount of deposition material, and a housing surrounding the body, the housing including an inflow port that exposes one of the deposition amount sensors.

13 Claims, 6 Drawing Sheets

100
200
220
120
S
M
Controller
400
300
310
z
x
y

Dispose deposition source and substrate to face each other — S10
Spray deposition material onto substrate — S20
S30 — Successively measure deposition amount
Periodically measure reference deposition amount — S40
S50 — Compare successively measured deposition amount to periodically measured reference deposition amount
Difference between two values deviates from preset range?
Yes
S70 — Replace deposition amount sensor to successively measure deposition amount
No
Correct sensitivity of deposition amount sensor to successively measure deposition amount — S60

(56) References Cited

U.S. PATENT DOCUMENTS

2011/0079178 A1* 4/2011 Schramm et al. ............ 118/712
2012/0114833 A1* 5/2012 Nakagawa et al. ............... 427/8
2012/0114839 A1* 5/2012 Fukuda et al. .................... 427/9

* cited by examiner

DEPOSITION AMOUNT MEASURING APPARATUS, DEPOSITING APPARATUS INCLUDING THE SAME, AND METHOD FOR MANUFACTURING LIGHT EMITTING DISPLAY

CROSS-REFERENCE TO RELATED APPLICATION

This application claims priority under 35 U.S.C. §119 to Korean Patent Application No. 10-2012-0124964 filed in the Korean Intellectual Property Office on Nov. 6, 2012, and entitled: "DEPOSITION AMOUNT MEASURING APPARATUS, DEPOSITING APPARATUS INCLUDING THE SAME, AND METHOD FOR MANUFACTURING LIGHT EMITTING DISPLAY," the entire contents of which are incorporated herein by reference.

BACKGROUND

1. Field

Embodiments relate generally to a deposition amount measuring apparatus, a depositing apparatus including the same, and a method for manufacturing a light emitting display. More particularly, embodiments relate to a deposition amount measuring apparatus for measuring the amount of a material deposited on a substrate used for manufacturing an organic light emitting diode (OLED) display, a depositing apparatus including the same, and a method for manufacturing a light emitting display.

2. Description of the Related Art

Among display devices, an OLED display has a wide viewing angle, excellent contrast, and high response speed. Therefore, much attention is being paid to the OLED display as a next generation display device.

In general, the OLED display has a stacked structure in which an emission layer is inserted between an anode and a cathode. Accordingly, the OLED display may implement a color according to the principle in which holes and electrons injected from the anode and the cathode, respectively, are recombined in a light emission layer to emit light. To obtain high-efficiency light emission, intermediate layers such as an electron injection layer (EIL), an electron transport layer (ETL), a hole transport layer (HTL), and a hole injection layer (HIL) may be additionally and selectively inserted between each electrode and the emission layer.

In a flat panel display device such as the OLED display, a vacuum deposition method is used, in which an organic material or metal used as an electrode is deposited under a vacuum atmosphere so as to form a thin layer on a flat panel. The vacuum deposition method is performed by positioning a substrate to form an organic thin film in a vacuum chamber, closely attaching a fine metal mask (FMM) having the same pattern as a pattern such as the thin film to be formed, and evaporating and sublimating an organic material using a deposition source, thereby depositing the organic material on the substrate.

SUMMARY

Embodiments are directed to a deposition amount measuring apparatus including a plate-shaped body having a rotating shaft, a plurality of deposition amount sensors along side surfaces of the body, the deposition amount sensors being configured to measure an amount of deposition material, and a housing surrounding the body, the housing including an inflow port that exposes one of the deposition amount sensors.

The body may have a plate surface formed in a circular or regular polygonal shape.

The deposition amount measuring apparatus may further include an inflow amount control unit surrounding the housing and having an opening formed to expose the inflow port, the inflow amount control unit being configured to rotate about the rotating shaft.

The deposition amount sensor may include a quartz crystal microbalance (QCM).

The deposition amount measuring apparatus may further include a controller configured to control a rotation of the body such that the one of the deposition amount sensors exposed through the inflow port is concealed and an adjacent one of the deposition amount sensors is exposed.

The controller may control a rotation of the inflow amount control unit.

Embodiments are also directed to a depositing apparatus including a deposition source configured to spray a deposition material onto a substrate facing the deposition source, a deposition amount measuring apparatus including a deposition amount sensor disposed in a spray direction of the deposition material and configured to successively measure a deposition amount of the deposition material, a reference deposition amount measuring apparatus including a reference deposition amount sensor disposed in the spray direction of the deposition material and configured to periodically measure the deposition amount of the deposition material, and a controller configured to correct a measuring sensitivity of the deposition amount sensor of the deposition amount measuring apparatus. The controller may periodically correct a measuring sensitivity of the deposition amount sensor based on a reference deposition amount measured by the reference deposition amount sensor.

The deposition amount measuring apparatus may include a first plate-shaped body having a rotating shaft, a plurality of deposition amount sensors disposed along side surfaces of the first plate-shaped body, and a housing surrounding the first plate-shaped body and having an inflow port that exposes one of the deposition amount sensors.

The first plate-shaped body may have a plate surface having a circular shape or regular polygonal shape.

The deposition amount measuring apparatus may further include an inflow amount control unit surrounding the housing, the inflow amount control unit having an opening to expose the inflow port, the inflow amount control unit being configured to rotate about the rotating shaft. The controller may control a rotation speed of the inflow amount control unit.

The reference deposition amount measuring apparatus may include a second plate-shaped body having a rotating shaft, a reference deposition amount sensor on side surfaces of the second plate-shaped body, and a housing surrounding the second plate-shaped body and having an inflow port to expose the reference deposition amount sensor. The controller may control the second plate-shaped body of the reference deposition amount measuring apparatus to be rotated to periodically expose the reference deposition amount sensor.

The deposition amount measuring apparatus and the reference deposition amount measuring apparatus may be adjacent to each other such that the respective plate surfaces of the first plate-shaped body and the second plate-shaped body face each other.

The deposition source may include a linear deposition source elongated in one direction. The deposition amount measuring apparatus and the reference deposition amount measuring apparatus may be located such that respective rotating shafts of the first plate-shaped body and the second plate-shaped body cross the one direction.

The deposition amount sensor and the reference deposition amount sensor may include a QMC.

The controller may control the first plate-shaped body to be periodically rotated to conceal the one of the deposition sensors exposed through the inflow port and expose an adjacent one of the deposition sensors.

The controller may control a heating temperature of the deposition source based on a deposition amount measured by the deposition amount measuring apparatus.

Embodiments are also directed to a method for manufacturing an organic light emitting diode (OLED) display including disposing a substrate to face a deposition source configured to spray a deposition material, spraying the deposition material onto the substrate by heating the deposition source, successively measuring a deposition amount of the deposition material using a deposition amount sensor to provide a measured value obtained by the deposition amount sensor, periodically measuring a reference deposition amount of the deposition material using a reference deposition amount sensor to provide a measured value obtained by the reference deposition amount sensor, comparing the measured value obtained by the deposition amount sensor to the measured value obtained by the reference deposition amount sensor, whenever the reference deposition amount is measured, and correcting a measuring sensitivity of the deposition amount sensor based on the measured value obtained the reference deposition amount sensor.

In the comparing of the measured value obtained by the deposition amount sensor to the measured value obtained by the reference deposition amount sensor, when a difference between the measured value obtained by the deposition amount sensor to the measured value obtained by the reference deposition amount sensor deviates from a preset range, the method may further include replacing the deposition amount sensor.

A heating temperature of the deposition source may be controlled based on the deposition amount measured by the deposition amount sensor.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
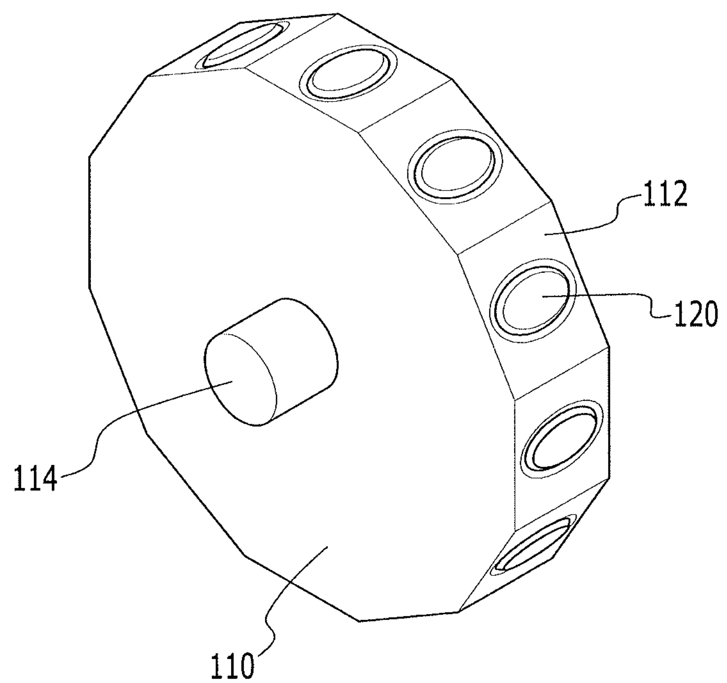
FIG. 1 is a perspective view of a body of a deposition amount measuring apparatus according to an exemplary embodiment.

Hereinafter, a deposition amount measuring apparatus, a depositing apparatus including the same, and a method for manufacturing a light emitting diode display according to the present invention will be described in detail with reference to the accompanying drawings. As those skilled in the art would realize, the described exemplary embodiments may be modified in various different ways, all without departing from the spirit or scope of the present invention. On the contrary, exemplary embodiments introduced herein are provided to make disclosed contents thorough and complete and sufficiently transfer the spirit of the present invention to those skilled in the art. Like reference numerals designate like elements throughout the drawings.

In the drawings, the thickness of layers, films, panels, regions, etc., are exaggerated for clarity. In the drawings, the thicknesses of some layers and regions are exaggerated for better understanding and ease of description. It will be understood that when an element such as a layer, film, region, or substrate is referred to as being “on” another element, it can be directly on the other element or intervening elements may also be present.

Further, unless explicitly described to the contrary, the word “comprise” and variations such as “comprises” or “comprising” will be understood to imply the inclusion of stated elements but not the exclusion of any other elements. In addition, throughout this specification, the word “on” will be understood to be positioned above or below a target portion, and will be not necessarily understood to be positioned at an upper side based on a gravity direction.

Figure 2:
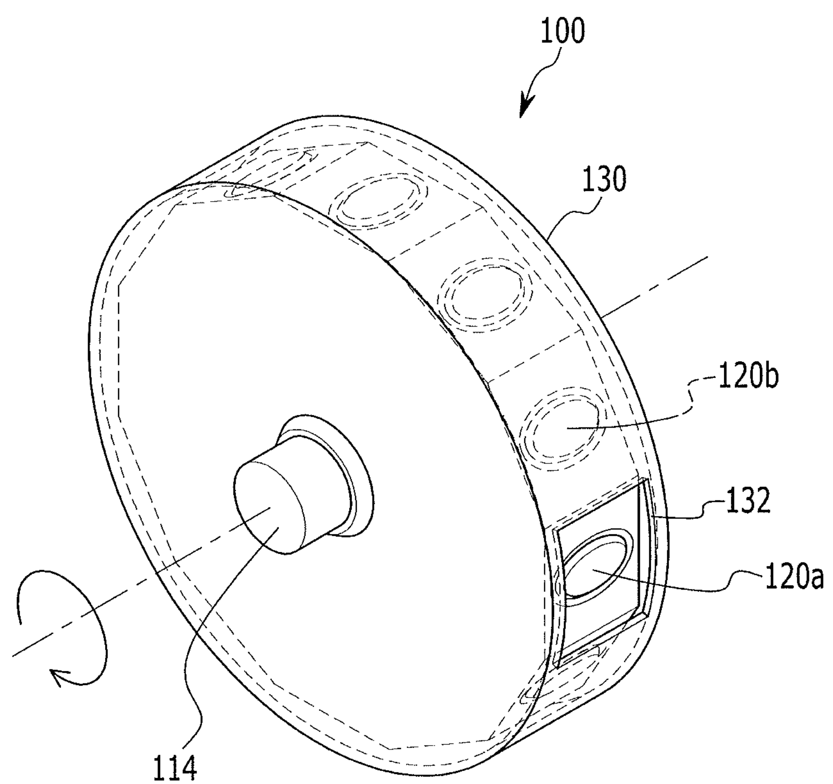
FIG. 2 is a perspective view of the deposition amount measuring apparatus according to the exemplary embodiment.

FIG. 1 is a perspective view of a body of a deposition amount measuring apparatus according to an exemplary embodiment, and FIG. 2 is a perspective view of the deposition amount measuring apparatus according to this exemplary embodiment.

The deposition amount measuring apparatus 100 according to the first embodiment is disposed in a depositing apparatus to form an organic thin film on a substrate and measures the deposition amount of an organic material to be deposited. Referring to FIGS. 1 and 2, the deposition amount measuring apparatus 100 includes a body 110, a plurality of deposition amount sensors 120, and a housing 130.

The body 110 is formed in a plate shape and includes a rotating shaft 114 perpendicular to the plate shape. The body 110 may be rotated in the clockwise direction or counterclockwise direction about the rotating shaft 114. The plate surface of the body 110 may be formed in a circular or regular polygonal shape such that the body 110 is smoothly rotated. In this case, the rotating shaft 114 may be defined as the mass center of the body 110.

The plurality of deposition amount sensors 120 to measure the amount of a deposition material is disposed along side surfaces 112 of the body 110. The deposition amount sensor 120 may include a quartz crystal microbalance (QCM) sensor. The term “QCM” refers to a measurement element using the piezoelectric characteristic of quartz. The QCM sensor vibrates at a resonance frequency of quartz when an AC voltage is applied to an electrode formed by coating both surfaces of a thin quartz plate with a metal. One electrode of the QCM may be exposed at a position from which a deposition material is sprayed, and the variation of the resonance frequency based on the mass change of the material attached on the electrode surface may be measured to determine how much weight is applied to the quartz plate electrode. The frequency variation measured by the QCM may be converted into a deposition amount by a controller to measure the deposition amount.

When a predetermined measurement time elapses, the deposition material becomes accumulated on the quartz plate electrode of the QCM sensor in the deposition amount sensor.

Accordingly, the deposition amount sensor may report a larger amount than the amount of the deposition material that is actually introduced into the deposition amount sensor. Due to such an error, the deposition amount sensor may not be able to precisely measure a deposition amount. In this case, it is desirable that the sensitivity of the deposition amount sensor be corrected or that the deposition amount sensor be replaced. This operation will be described below.

When the plate surface of the body 110 is formed in a circular shape, the plurality of deposition amount sensors 120 may be disposed at even intervals along the circumference of the body 110. When the plate surface of the body 110 is formed in a regular polygonal shape, one deposition amount sensor 120 may be disposed on each of the side surfaces 112 as shown in FIG. 1.

The housing 130 serves to protect the plurality of deposition amount sensors 120 from exposure to the deposition material, excluding one deposition sensor 120 that actually measures a deposition amount. The housing 130 surrounds the body 110 and has an inflow port 132 to expose one of the deposition amount sensors 120. The housing 130 may be formed in a cylindrical shape as shown in FIG. 2. In this case, the inflow port 132 formed on the circumference has a larger area than the area of the deposition amount sensor 120.

When the lifespan of the exposed deposition amount sensor 120*a* is near an end or if the deposition amount sensor 120 breaks down while the deposition amount sensor 120*a* measures an amount of deposition material sprayed, it is desirable that the deposition amount sensor 120*a* be replaced. In this case, the controller may control the body 110 to rotate such that the deposition amount sensor 120*a* exposed through the inflow port 132 is concealed in the housing 130 and another deposition amount sensor 120*b* adjacent to the deposition amount sensor 120*a* is exposed.

Figure 3:
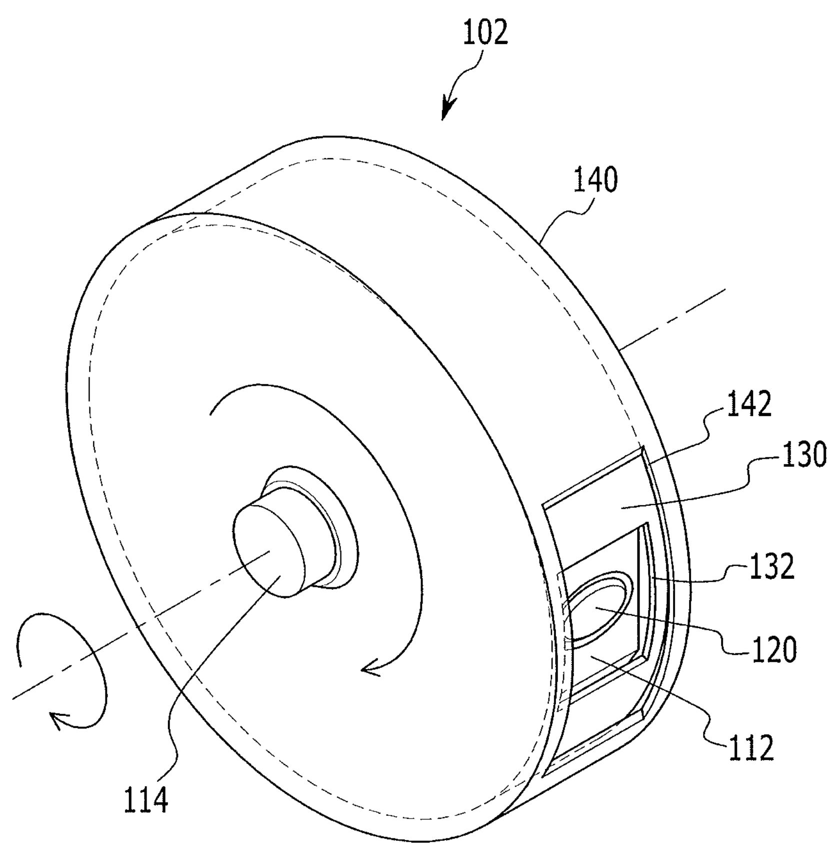
FIG. 3 is a perspective view of a deposition amount measuring apparatus according to another exemplary embodiment.

FIG. 3 is a perspective view of a deposition amount measuring apparatus according to another exemplary embodiment.

The deposition amount measuring apparatus 102 according to this exemplary embodiment has the same structure as the above-described deposition amount measuring apparatus 100 according to the first exemplary embodiment, except that an inflow amount control unit 140 is added. The duplicated descriptions for the same components as those of the first exemplary embodiment are not repeated herein, and like reference numerals will be attached to the same components.

The inflow amount control unit 140 serves to control the amount of a deposition material that is introduced through the inflow port 132 so as to adhere to the deposition amount sensor 120. The inflow amount control unit 140 may prevent an error from occurring in the measured value of the deposition amount sensor 120, such as may be caused by a large amount of deposition material adhering to the deposition amount sensor 120. The inflow amount control unit may prevent or minimize a reduction in the lifespan of the deposition amount sensor 120.

The inflow amount control unit 140 surrounds the housing 130 and has an opening 142 that has a larger size than the area of the inflow port 132 so as to expose the inflow port 132. The housing 130 may be formed in a cylindrical shape as shown in FIG. 2. In this case, the inflow port 132 is formed on the circumference of the housing 130.

The inflow amount control unit 132 is formed to rotate about the rotating shaft 114 of the body 110. Even while the deposition amount sensor 120 measures the deposition material, the inflow amount control unit 132 is continuously rotated to control the amount of deposition material introduced through the inflow port 132. When the amount of deposition material to be introduced is intended to be increased, the rotation speed of the inflow amount control unit 140 may be increased. When the amount of deposition material to be introduced is intended to be reduced, the rotation speed of the inflow amount control unit 140 may be decreased. The rotation of the inflow amount control unit 140 may be controlled by the controller.

In order to efficiently measure the amount of deposition material to be sprayed, the deposition amount measuring apparatus is disposed in such a manner that the deposition material is vertically introduced to the deposition amount sensor. The deposition amount sensor of the deposition amount measuring apparatus in the related art is coupled to the plate surface of the body. Therefore, the plate surface of the body needs to be disposed to face the deposition source spraying the deposition material such that the deposition material is vertically introduced. Therefore, there is a spatial limitation in installing the deposition amount measuring apparatus. On the other hand, the deposition amount measuring apparatuses 100 and 102 according to the exemplary embodiments do not need to be disposed to face the deposition source such that the deposition material is vertically introduced. Accordingly, the space utilization may be improved.

Hereinafter, referring to the drawings, a depositing apparatus according to an exemplary embodiment will be described.

Figure 4:
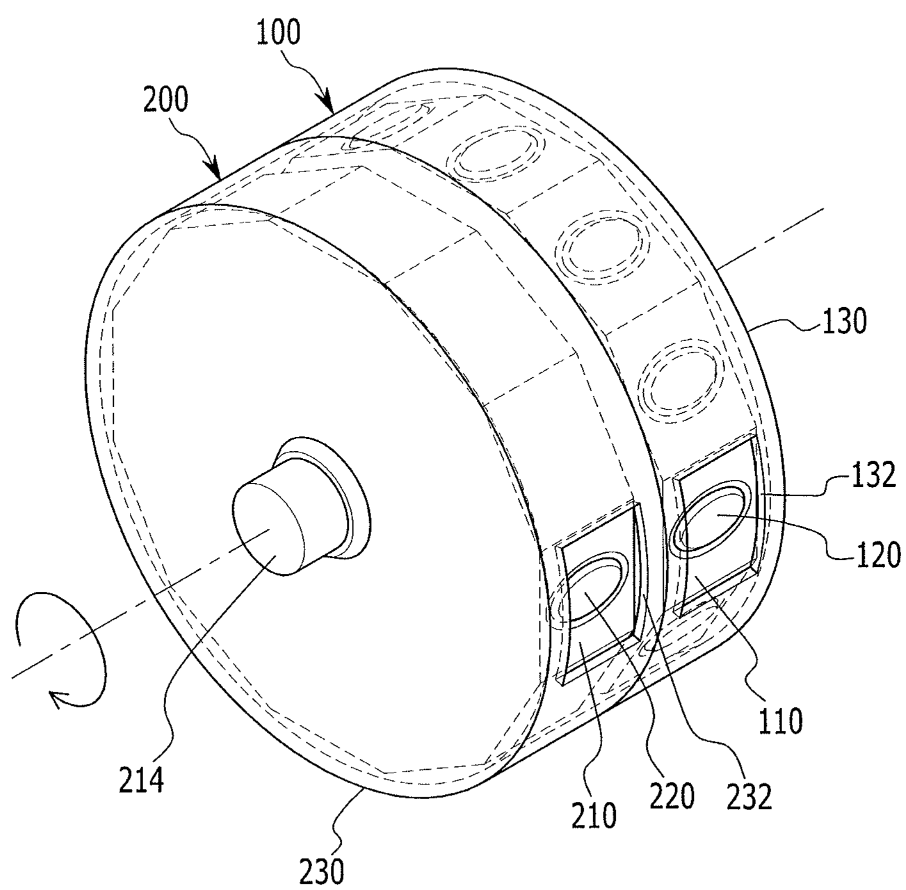
FIG. 4 is a schematic perspective view of a depositing apparatus according to an exemplary embodiment.
Figure 5:
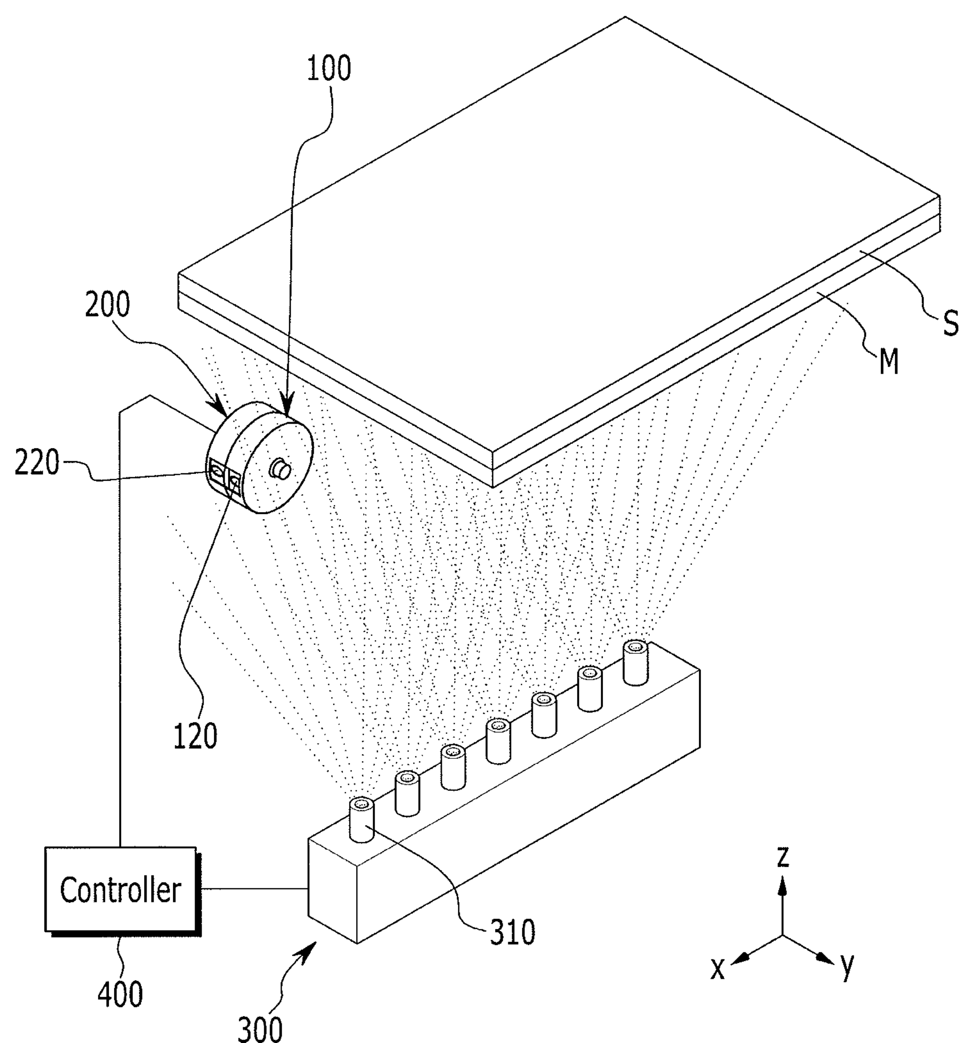
FIG. 5 is a perspective view of a deposition amount measuring apparatus and a reference deposition amount measuring apparatus in the depositing apparatus of FIG. 4.

FIG. 4 is a schematic perspective view of a depositing apparatus according to an exemplary embodiment and FIG. 5 is a perspective view of a deposition amount measuring apparatus and a reference deposition amount measuring apparatus in the depositing apparatus of FIG. 4.

Referring to FIGS. 4 and 5, the depositing apparatus according to the exemplary embodiment includes a deposition source 300, a deposition amount measuring apparatus 100, a reference deposition amount measuring apparatus 200, and a controller 400.

All components of FIG. 4 are arranged in a vacuum chamber maintaining a proper vacuum level. The vacuum chamber may have various shapes depending on the shape of a substrate to be processed. In the exemplary embodiment, a substrate having a rectangular shape is taken as an example. Further, this vacuum chamber may further include a vacuum pump and a venting unit. The vacuum pump discharges internal gas of the vacuum chamber to reduce the internal pressure of the vacuum chamber, and the venting unit injects predetermined gas into the vacuum chamber to increase the internal pressure of the vacuum chamber.

The deposition source 300 serves to discharge a deposition material to be deposited on the substrate S. The deposition source 300 has an internal space (not shown) capable of housing the deposition material such as an organic material therein, and includes a plurality of spray nozzles 310 formed at one side of the deposition source 300 facing the substrate S so as to spray the deposition material. The deposition material housing space may be formed of a ceramic material such as alumina ($Al_2O_3$) or aluminum nitride (AlN) having excellent heat emission. The deposition material housing space is not limited thereto, and may be formed of various materials having excellent heat emission and heat resistance. On the outer surface of the deposition material housing space, a heater (not shown) may be closely attached to surround the outer surface. The heater serves to heat and evaporate the housed deposition material. The controller 400 to be described below may control the temperature of the heater to control the amount of deposition material to be heated. The deposition source 300 may include a linear deposition source elongated in one direction corresponding to the lengthwise direction (x-axis direction) of the substrate S facing the deposition source 300.

The substrate S is fixed by a substrate fixing unit (not shown) so as to face the spray nozzles 310 of the deposition source 300. The substrate fixing unit stably fixes the substrate S while a thin film is formed on the substrate S by the deposition material, and discharge the substrate S to the outside after the process is completed. Therefore, the substrate fixing unit has a structure capable of easily mounting and demounting the substrate S. The substrate fixing unit has the same structure as a component used in a typical depositing apparatus. Therefore, the detailed descriptions thereof are omitted herein. The substrate S is fixed to the substrate fixing unit with a deposition mask M. The deposition mask M is used to form an organic layer pattern on the substrate S, and an organic material may be deposited on the substrate S through an opening formed between shield units to block the deposition of the organic material.

The deposition amount measuring apparatus 100 is disposed in the spray direction of the deposition material, for example, between the substrate S and the deposition source 300. The deposition amount measuring apparatus 100 successively measures the deposition amount of deposition material sprayed from the deposition source 300. The deposition amount measuring apparatus 100 includes a deposition amount sensor 120 to measure the deposition material. The deposition amount measuring apparatus 100 may have the same structure as the above-described deposition amount measuring apparatuses 100 and 102 according to the first and second exemplary embodiments and the detailed descriptions thereof are not repeated.

The controller 400 may control the amount of deposition material to be heated, for example, the deposition amount, by controlling the heating temperature of the heater provided on the deposition source 300 based on the deposition amount measured by the deposition amount measuring apparatus 100. When the amount measured by the deposition amount measuring apparatus 100 is larger than an amount intended to be deposited, the heating temperature of the heater is lowered. In the opposite case, the heating temperature of the heater is raised.

The reference deposition amount measuring apparatus 200 serves to define a reference value for correcting the sensitivity of the deposition amount sensor 120, and includes a reference deposition amount sensor 220 to measure a deposition material. The reference deposition amount measuring apparatus 200 is disposed in the spray direction of the deposition material and periodically measures the deposition amount of deposition material so as to suggest a reference value for correcting the sensitivity of the deposition amount sensor 120 during each measurement. The controller 400 may correct the measuring sensitivity of the deposition amount sensor 120 based on the reference value periodically measured by the reference deposition amount sensor 220. A specific correction method will be described below.

The reference deposition amount measuring apparatus 200 may include a plate-shaped body 210 having a rotating shaft 214 provided therein, a reference deposition amount sensor 220 disposed on a side surface of the body 210, and a housing 230 surrounding the body 210 and having an inflow port 232 to expose the reference deposition amount sensor 220. The reference deposition amount measuring apparatus 200 may have the same structure as the deposition amount measuring apparatus 100 except that one reference deposition amount sensor 220 is formed on the side surface of the body 210.

When a deposition amount is not being measured, the controller 400 controls the reference deposition amount sensor 220 to be positioned inside the housing 230 and isolated from the deposition material. When the deposition amount is being measured, the controller 400 controls the body 210 to be rotated such that the reference deposition amount sensor 220 is positioned at the inflow port 232 of the housing 230 and exposed to the deposition material. When the deposition amount measurement is completed, the controller 400 controls the body 210 to be rotated such that the reference deposition amount sensor 220 is concealed into the housing 230. Such an operation may be repeated to periodically measure a reference deposition amount through the reference deposition amount sensor 220.

As shown in FIG. 5, the deposition amount measuring apparatus 100 and the reference deposition amount measuring apparatus 200 may be disposed adjacent to each other such that the plate surfaces of the bodies 110 and 210 face each other. Further, both of the reference deposition amount sensor 220 and the deposition amount sensor 120 may include a QCM.

When the deposition source 300 is a linear deposition source elongated in one direction (x-axis direction), the deposition amount measuring apparatus 100 and the reference deposition amount measuring apparatus 200 may be disposed in such a manner that each rotating shaft thereof crosses the elongation direction as shown in FIG. 4.

Hereinafter, referring to the drawings, a method for manufacturing an OLED display according to the exemplary embodiment will be described.

Figure 6:
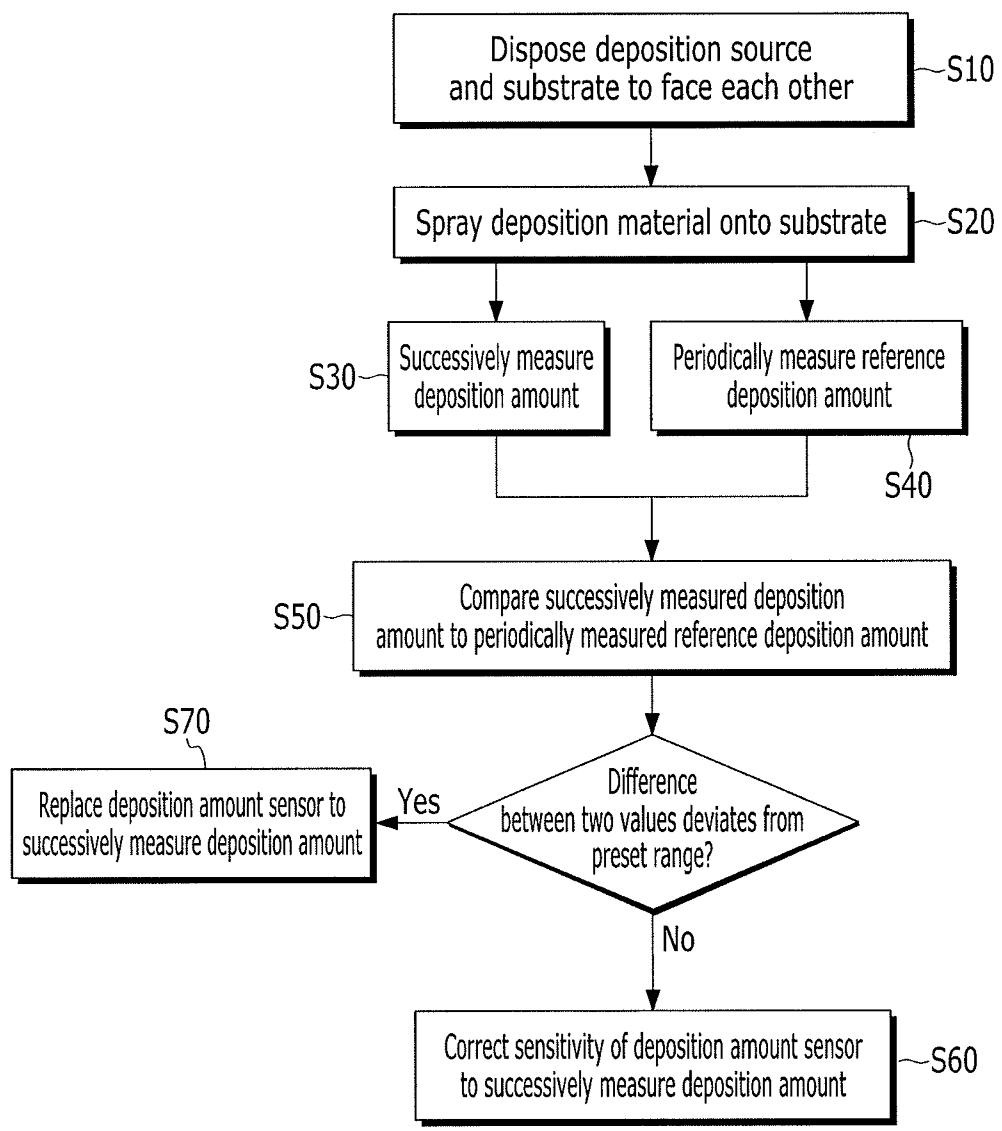
FIG. 6 is a flow chart showing a method for manufacturing an OELD display according to an exemplary embodiment.

FIG. 6 is a flowchart showing a method for manufacturing an OLED display according to the exemplary embodiment.

Referring to FIG. 6, the method for manufacturing an OLED display according to the exemplary embodiment includes disposing a deposition source and a substrate (S10); spraying a deposition material onto the substrate (S20); successively measuring a deposition amount (S30); periodically measuring a reference deposition amount (S40); comparing the measured deposition amount and the measured reference deposition amount (S50); and correcting the measuring sensitivity of the deposition amount sensor to successively measure the deposition amount (S60).

First, the substrate S is disposed to face the deposition source 300 to spray the deposition material (S10). The deposition mask M having the same pattern as the pattern of a thin layer to be formed is closely attached and disposed on the substrate S. When the deposition source 300 is a linear deposition source elongated in one direction (x-axis direction), the deposition source 300 is disposed in such a manner that the one direction of the deposition source 300 is parallel to one side of the substrate S. Further, the deposition amount measuring apparatus 100 and the reference deposition amount measuring apparatus 200 are disposed between the deposition source 300 and the substrate S.

Then, the deposition source 300 is heated to spray the deposition material onto the substrate S (S20). The heater installed in the deposition source 300 is heated to evaporate the deposition material housed in the deposition source. Then, the deposition material is sprayed onto the substrate S through the spray nozzle 310. In this case, the deposition amount sensor 120 is controlled to be exposed to the deposition material, and the reference deposition amount sensor 220 is controlled to not be exposed to the deposition material.

While the deposition material is sprayed onto the substrate S, the deposition amount sensor 120 successively measures the deposition amount of deposition material (S30). This is in order to determine how uniformly the deposition material is sprayed during the deposition process or how much deposition material is sprayed and at which speed the thickness of the thin film is grown. The deposition amount sensor 120 disposed in the deposition amount measuring apparatus 100 may successively measure the deposition amount, and may include a QCM.

Based on the deposition amounts which are successively measured during the deposition process, the heating temperature of the deposition source 300 may be controlled. That is, the deposition amount is monitored through the controller 400 in real time during the deposition process. When the measured deposition amount is larger than a preset value, the heating temperature of the heater of the deposition source 300 may be lowered through the controller 400 to reduce an amount evaporated from the deposition source 300. When the measured deposition amount is smaller than the preset value, the heating temperature of the heater of the deposition source 300 may be raised through the controller 400 to increase an amount evaporated from the deposition source 300.

During the deposition process, the reference deposition amount sensor 220 periodically measures the reference deposition amount (S40). The reference deposition amount sensor 220 disposed in the reference deposition amount measuring apparatus 200 periodically measures the deposition amount, and may include a QCM. The reference deposition amount sensor 220 is concealed into the housing 230 of the reference deposition amount measuring apparatus 200 during the deposition process. However, when a deposition amount is intended to be measured, the reference deposition amount sensor 220 is exposed to the outside of the housing 230 by the rotation of the body 220 so as to measure the deposition amount. After the measurement, the reference deposition amount sensor 220 is concealed again into the housing by the rotation of the body 220.

The reason for measuring the reference deposition amount is to correct the measuring sensitivity of the deposition amount sensor 120 through the reference deposition amount. The deposition amount sensor 120 measures the deposition amount of deposition material during the entire deposition process. Therefore, when a predetermined time elapses during the deposition process, a large amount of deposition material may be accumulated on the deposition amount sensor 120. In this case, the deposition amount may be inaccurately measured.

Whenever the reference deposition amount is measured, the measured deposition amount of the deposition amount sensor 120 is compared to the measured reference deposition amount of the reference deposition amount sensor 220 (S50). A value corresponding to a difference between the measured deposition amounts is used to correct the measuring sensitivity of the deposition amount sensor 120 (S60). The deposition amount sensor 120 may inaccurately measure the deposition amount as time passes during the deposition process. Therefore, an amount of deposition material to be actually sprayed may be compared to the accurately measured deposition amount such that the deposition sensor 120 accurately measures the deposition amount again.

Before the deposition process, the measuring sensitivities of the deposition amount sensor 120 and the reference deposition amount sensor 220 are set. The measuring sensitivities may be set differently depending on the positions at which the sensors are disposed and the type of deposition material. In the exemplary embodiment, when the deposition amount measuring apparatus 100 and the reference deposition amount measuring apparatus 200 are disposed in parallel to each other as shown in FIG. 4, the measuring sensitivities of the deposition amount sensor 120 and the reference deposition amount sensor 220 may be set to the same value. Then, the measured reference deposition amount of the reference deposition amount sensor 220 is used to correct the measuring sensitivity of the deposition amount sensor 120 during the deposition process.

In the exemplary embodiment, a case in which the deposition amount sensor 120 includes a QCM was taken as an example for describing the method for correcting the measuring sensitivity. However, the present invention is not limited thereto, but another sensor of which the measured value may differ with time may be applied to the method. When the deposition amount sensor 120 and the reference deposition amount sensor 220 sense a deposition material, a frequency change occurs depending on the deposition amount. The controller 400 converts the frequency change at a predetermined magnification and indicates the frequency change as an actual deposition amount. In the exemplary embodiment, the measuring sensitivity indicates a conversion magnification for converting the frequency change of the deposition amount sensor 120 configured as a QCM into an actual deposition amount.

As described above, the deposition amount sensor 120 may read a larger amount than the amount of deposition material that is actually introduced to the deposition amount sensor 120, due to the deposition material accumulated on the sensor with time. Accordingly, the value displayed by the deposition amount sensor 120 may differ from the actual deposition amount. Therefore, an operation of correcting the measuring sensitivity (conversion magnification) of the deposition amount sensor 120 is desirable. The reference deposition amount sensor 220 is exposed to measure a deposition amount, only when the reference deposition amount is to be measured. Therefore, an error caused by the accumulation of the deposition material may not occur.

The method for correcting the measuring sensitivity of the deposition amount sensor 120 by comparing the measured values will be described by taking numerical values as examples. For example, if the amount of deposition material intended to be deposited through the deposition source 300 has a value of 10 per second, the deposition amount sensor 120 senses a deposition material corresponding to 10, and the controller 400 converts a frequency change corresponding to the deposition amount of 10 and indicates an actual deposition amount of 10. In this case, the conversion magnification corresponds to 1. When a predetermined time elapses after the deposition process is started, the deposition amount sensor 120 causes an error due to the deposition material accumulated on the sensor. During the process, the amount of deposition amount may be reduced to a value of 8 per second. In this case, however, the controller 400 still converts a frequency change corresponding to the deposition amount of 10 and then indicates an actual deposition amount as 10, due to the deposition material accumulated on the sensor and corresponding to 2. In this case, when the reference deposition amount sensor 220 is exposed to measure the reference deposition amount, the reference deposition amount sensor 220 has no error caused by the accumulation of the deposition material. Therefore, the controller 400 indicates the amount of deposition material as 8 corresponding to the actual deposition amount. Through the comparison to the reference value measured by the reference deposition amount sensor 220, it can be seen that the deposition amount sensor 120 read the deposition amount of 8 as 10. The difference of 2 therebetween corresponds to an error of the deposition amount sensor 120. In this case, the conversion magnification is adjusted based on the reference value of 8 measured by the reference deposition amount sensor such that the deposition amount sensor 120 reads the actual deposition amount as 8 instead of the deposition amount of 10. In this case, the conversion magnification becomes 0.8. Then, the deposition amount sensor 120 may accurately measure the deposition amount in real time. Then, when a predetermined elapses, the conversion magnification (measuring sensitivity) of the deposition amount sensor 120 may be controlled while the above-described process is repeated.

A large difference between the measured value of the deposition amount sensor 120 and the measured value of the reference deposition amount sensor 220 may occur. That is, the deposition amount sensor 120 may cause a large error. When a difference between two values is larger, it may be difficult for the deposition amount sensor 120 to accurately sense the deposition amount even though the measuring sensitivity of the deposition amount sensor 120 is corrected. Therefore, when the error of the deposition amount sensor 120 exceeds a predetermined maximum permissible error, the deposition amount sensor 120 may be replaced. In the above-described example, the maximum permissible error of the deposition amount sensor 120 was set to 3. For example, when the deposition amount sensor 120 reads an actual deposition amount of 8 as 13, the deposition sensor 120 may be replaced.

In the case of the deposition amount measuring apparatus 100 according to the exemplary embodiment, the body 110 is rotated to conceal an exposed deposition amount sensor 120*a* into the housing 130, and a fresh deposition amount sensor 120*b* concealed into the housing 130 may be exposed to replace the deposition amount sensor 120 (refer to FIG. 2).

By way of summation and review, in order to measure the thickness of a thin film formed by attaching a deposition material on the substrate during a deposition process, a deposition amount measuring apparatus to measure the amount of a deposition material sprayed from the deposition source is installed between the deposition source and the substrate.

The deposition amount measuring apparatus generally may include a plurality of deposition amount sensors attached on the surface of a plate-shaped member. The deposition amount sensors successively measure the deposition amount during the deposition process while being exposed one at a time. The deposition sensors are generally attached on the plate surface. Accordingly, the deposition amount measuring apparatus may be disposed in such a manner that the entire plate surface faces the deposition source. In this configuration, a vacuum chamber may have a spatial limitation therein. Further, when the deposition amount is successively measured during the deposition process, the deposition material may be accumulated on the deposition amount sensors as a predetermined time elapses. Accordingly, the precision of the deposition amount sensors may decrease with time.

In contrast, embodiments may provide a deposition amount measuring apparatus having advantages of being capable of measuring a deposition amount without a spatial limitation inside a vacuum. A measurement error occurring during a deposition process may be corrected. Accordingly, the deposition amount measuring apparatus may be continuously used for a long time. Although the deposition amount measuring apparatus is used for a long time, any error may be minimized, and the deposition amount may be accurately measured.

As the deposition amount is accurately measured, the thickness uniformity of the organic light emitting layer may be increased to improve the quality of the OLED display.

Embodiments may also provide a depositing apparatus and a method for manufacturing an organic light emitting diode (OLED) display having advantages of being capable of measuring a deposition amount while correcting a measurement error occurring during a deposition process.

While this disclosure has been described in connection with what is presently considered to be practical exemplary embodiments, it is to be understood to not be limited to the disclosed embodiments, but, on the contrary, is intended to cover various modifications and equivalent arrangements included within the spirit and scope of the appended claims.

What is claimed is:

1. A depositing apparatus, comprising:

a deposition source configured to spray a deposition material onto a substrate facing the deposition source;

a deposition amount measuring apparatus including a deposition amount sensor disposed in a spray direction of the deposition material and configured to successively measure a deposition amount of the deposition material;

a reference deposition amount measuring apparatus including a reference deposition amount sensor provided in the spray direction of the deposition material and configured to periodically measure the deposition amount of the deposition material; and a controller configured to correct a measuring sensitivity of the deposition amount sensor of the deposition amount measuring apparatus, wherein the controller periodically corrects a measuring sensitivity of the deposition amount sensor based on a reference deposition amount measured by the reference deposition amount sensor.

2. The depositing apparatus as claimed in claim 1, wherein:

the deposition amount measuring apparatus includes a first plate-shaped body having a rotating shaft, a plurality of deposition amount sensors disposed along side surfaces of the first plate-shaped body, and a housing surrounding the first plate-shaped body and having an inflow port that exposes one of the deposition amount sensors.

3. The depositing apparatus as claimed in claim 2, wherein:

the first plate-shaped body has a plate surface having a circular shape or regular polygonal shape.

4. The depositing apparatus as claimed in claim 2, wherein:

the deposition amount measuring apparatus further includes an inflow amount control unit surrounding the housing, the inflow amount control unit having an opening to expose the inflow port, the inflow amount control unit being rotatable about the rotating shaft, and the controller controls a rotation speed of the inflow amount control unit.

5. The depositing apparatus as claimed in claim 2, wherein:

the reference deposition amount measuring apparatus includes a second plate-shaped body having another rotating shaft, another reference deposition amount sensor on side surfaces of the second plate-shaped body, and another housing surrounding the second plate-shaped body and having another inflow port to expose the reference deposition amount sensor, and the controller controls the second plate-shaped body of the reference deposition amount measuring apparatus to be rotated to periodically expose the reference deposition amount sensor.

6. The depositing apparatus as claimed in claim 5, wherein:

the deposition amount measuring apparatus and the reference deposition amount measuring apparatus are adjacent to each other such that respective plate surfaces of the first plate-shaped body and the second plate-shaped body face each other.

7. The depositing apparatus as claimed in claim 6, wherein:

the deposition source includes a linear deposition source elongated in one direction, and the deposition amount measuring apparatus and the reference deposition amount measuring apparatus are located such that respective rotating shafts of the first plate-shaped body and the second plate-shaped body cross the one direction.

8. The depositing apparatus as claimed in claim 2, wherein the deposition amount sensor and the reference deposition amount sensor include a QMC.

9. The depositing apparatus as claimed in claim 2, wherein the controller controls the first plate-shaped body to be periodically rotated to conceal the one of the deposition sensors exposed through the inflow port and expose an adjacent one of the deposition sensors.

10. The depositing apparatus as claimed in claim 1, wherein:

the controller controls a heating temperature of the deposition source based on the deposition amount measured by the deposition amount measuring apparatus.

11. A method for manufacturing an organic light emitting diode (OLED) display, the method comprising:

disposing a substrate to face a deposition source configured to spray a deposition material;

spraying the deposition material onto the substrate by heating the deposition source;

successively measuring a deposition amount of the deposition material using a deposition amount sensor to provide a measured value obtained by the deposition amount sensor;

periodically measuring a reference deposition amount of the deposition material using a reference deposition amount sensor to provide a measured value obtained by the reference deposition amount sensor;

comparing the measured value obtained by the deposition amount sensor to the measured value obtained by the reference deposition amount sensor, whenever the reference deposition amount is measured; and correcting a measuring sensitivity of the deposition amount sensor based on the measured value obtained the reference deposition amount sensor.

12. The method as claimed in claim 11, further comprising:

in the comparing of the measured value obtained by the deposition amount sensor to the measured value obtained by the reference deposition amount sensor, when a difference between the measured value obtained by the deposition amount sensor to the measured value obtained by the reference deposition amount sensor deviates from a preset range, replacing the deposition amount sensor.

13. The method as claimed in claim 11, wherein:

a heating temperature of the deposition source is controlled based on the deposition amount measured by the deposition amount sensor.

* * * * *